United States Patent
Bayless et al.

(10) Patent No.: US 11,189,590 B2
(45) Date of Patent: Nov. 30, 2021

(54) PROCESSES FOR ADJUSTING DIMENSIONS OF DIELECTRIC BOND LINE MATERIALS AND RELATED FILMS, ARTICLES AND ASSEMBLIES

(71) Applicant: Micron Technology, Inc., Boise, ID (US)

(72) Inventors: Andrew M. Bayless, Boise, ID (US); Brandon P. Wirz, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/715,594

(22) Filed: Dec. 16, 2019

(65) Prior Publication Data

US 2021/0183806 A1 Jun. 17, 2021

(51) Int. Cl.
| | |
|---|---|
| H01L 23/00 | (2006.01) |
| H01L 21/78 | (2006.01) |
| H01L 25/065 | (2006.01) |
| H01L 23/31 | (2006.01) |
| H01L 25/00 | (2006.01) |
| H01L 23/29 | (2006.01) |

(52) U.S. Cl.
CPC .............. *H01L 24/32* (2013.01); *H01L 21/78* (2013.01); *H01L 23/293* (2013.01); *H01L 23/3121* (2013.01); *H01L 24/16* (2013.01); *H01L 24/27* (2013.01); *H01L 24/29* (2013.01); *H01L 24/73* (2013.01); *H01L 24/83* (2013.01); *H01L 24/94* (2013.01); *H01L 25/0657* (2013.01); *H01L 25/50* (2013.01); *H01L 24/17* (2013.01); *H01L 24/33* (2013.01); *H01L 2224/16146* (2013.01); *H01L 2224/16227* (2013.01); *H01L 2224/17181* (2013.01); *H01L 2224/276* (2013.01); *H01L 2224/2741* (2013.01); *H01L 2224/29018* (2013.01); *H01L 2224/32145* (2013.01); *H01L 2224/32225* (2013.01); *H01L 2224/33181* (2013.01); *H01L 2224/73204* (2013.01); *H01L 2224/73253* (2013.01); *H01L 2225/06513* (2013.01); *H01L 2225/06517* (2013.01); *H01L 2225/06541* (2013.01); *H01L 2225/06565* (2013.01); *H01L 2225/06582* (2013.01)

(58) Field of Classification Search
CPC . H01L 2225/06582; H01L 2224/32145; H01L 24/33; H01L 2224/29018; H01L 2224/33181; H01L 2224/32225; H01L 2225/06565; H01L 2224/2741; H01L 2224/276; H01L 24/83; H01L 25/0657; H01L 24/29; H01L 25/50; H01L 24/27; H01L 24/94; H01L 23/293; H01L 23/3121; H01L 24/16
See application file for complete search history.

(56) References Cited

U.S. PATENT DOCUMENTS 6,555,917 B1 * 4/2003 Heo .................. H01L 24/81
257/777

* cited by examiner

*Primary Examiner* — Jasmine J Clark
(74) *Attorney, Agent, or Firm* — TraskBritt (57) ABSTRACT

Processes for adjusting dimensions of dielectric bond line materials in stacks of microelectronic components to prevent extrusion of the dielectric bond line materials beyond component peripheries during thermocompression bonding by patterning the materials with boundary portions inset from component peripheries, or employing an inset dielectric material surrounded by another solidified dielectric material. Related material films, articles and assemblies are also disclosed.

20 Claims, 7 Drawing Sheets

PROCESSES FOR ADJUSTING DIMENSIONS OF DIELECTRIC BOND LINE MATERIALS AND RELATED FILMS, ARTICLES AND ASSEMBLIES

TECHNICAL FIELD

Embodiments disclosed herein relate to methods of reducing the formation and extent of fillets on peripheries of dielectric bond line materials related to stacked microelectronic components. More particularly, embodiments disclosed herein relate to adjusting dimensions of dielectric bond line films to reduce or eliminate the formation of peripheral fillets of bond line materials associated with thermocompression bonding of stacked microelectronic components.

BACKGROUND

Thermocompression bonding is a widely used technique for physically and electrically interconnecting vertically stacked microelectronic components (e.g., semiconductor die, semiconductor wafer) to fabricate, for example, stacks of semiconductor dice as employed in high bandwidth memory (HBM) devices, or to fabricate chip to wafer (C2W) assemblies. In thermocompression bonding, a bond head is employed to apply a normal force in conjunction with heat to vertically superimposed microelectronic components to cause physical and electrical coupling of aligned conductive elements of the components. Conventionally, thermocompression bonding may be used to effect reflow of a solder cap on a metal (e.g., copper, nickel) pillar on one component aligned with a compatible metal terminal pad of an adjacent component. In other instances, a copper pillar is diffusion bonded to a copper terminal pad responsive to the applied force and heat. Semiconductor die in each stack may be thermocompression bonded, level by level, as the stack is formed or, more commonly in recent years, gang-bonded after an entire stack is formed.

As a part of the thermocompression bonding process, a dielectric material is interposed in the so-called "bond line" between adjacent, superimposed microelectronic components to electrically isolate laterally adjacent conductive elements connecting the components and provide electrical isolation between the superimposed microelectronic components, as well as providing additional adhesion between the components. In recent years, it has become more common to stack preformed dielectric films adhered to microelectronic components or to dispense dielectric material on a microelectronic component before stacking, rather than dispensing a flowable dielectric material over each component during stacking, or using a post-stacking capillary underfill in the bond lines. Such preformed dielectric or pre-stacking dispensed material films are referred to as non-conductive films (NCFs), as well as wafer level underfill films (WLUFs). The term "dielectric film" will be used herein for the sake of convenience in referring to preformed or dispensed material dielectric films applied before microelectronic component stacking and known as NCFs and WLUFs. Such dielectric films typically comprise a silica particle-filled epoxy-type thermosetting resin at a B-stage partial cure, provide consistent thicknesses, may include a flux for the aforementioned solder reflow where applicable, and facilitate stacking of microelectronic components with a segment of dielectric film already in place on each singulated component before stacking.

The use of such dielectric films of rectangular shape and sized to conform to the outer boundaries of microelectronic components in a stack, in conjunction with thermocompression bonding techniques has resulted in yield issues as well as bond head contamination problems due to peripheral extension of filets (i.e., protrusions) of the dielectric film material beyond the sides of the components, and to a greatest extent along mid-points of the sides, responsive to the Normal force and heat applied by the bond head. Specifically, the application of heat and force by the bond head causes "squeeze out" (i.e., extrusion) of peripheral portions of the dielectric film as the thickness of the film decreases until the aligned conductive elements of adjacent components make contact and before the dielectric film is fully cured at a final bond line thickness between the components. In addition, it has been observed by the inventors herein that in many instances the magnitude of peripheral portions of the dielectric film comprising filets becomes progressively greater from upper film levels in a stack to lower film levels. As a result, the filets of dielectric material may also protrude upwardly and contaminate the bond head, but even if this does not occur the presence of the filets may compromise the formation and integrity of an epoxy molding compound (EMC) on sides of a microelectronic component stack, cause flammability issues due to the exposed dielectric film, or even extend between adjacent stacks of microelectronic components formed on a base substrate, such as a base wafer, which may cause the aforementioned issues with the EMC as well as create warpage of the base wafer. Such filets result in non-linear component stack sides and other anomalies affecting thickness and continuity of the EMC, causing damage when adjacent microelectronic components are singulated with a dicing saw cutting along streets incompletely filled with the EMC in the path of the saw blade. While currently stacks of microelectronic components are generally separated by a fair distance, for example about 600 μm, this distance continues to shrink as circuit density increases, allowing for smaller microcomponent size and more and more closely spaced components per wafer.

Figure 1:
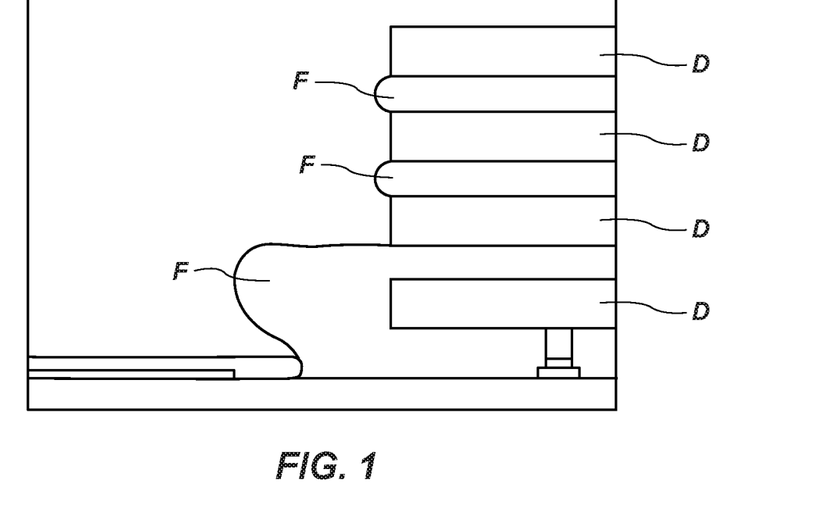
FIG. 1 is a side elevation photomicrograph of a thermocompression bonded semiconductor die stack showing a filet of dielectric material at a side of a semiconductor die stack configured as an HBM assembly.
Figure 2:
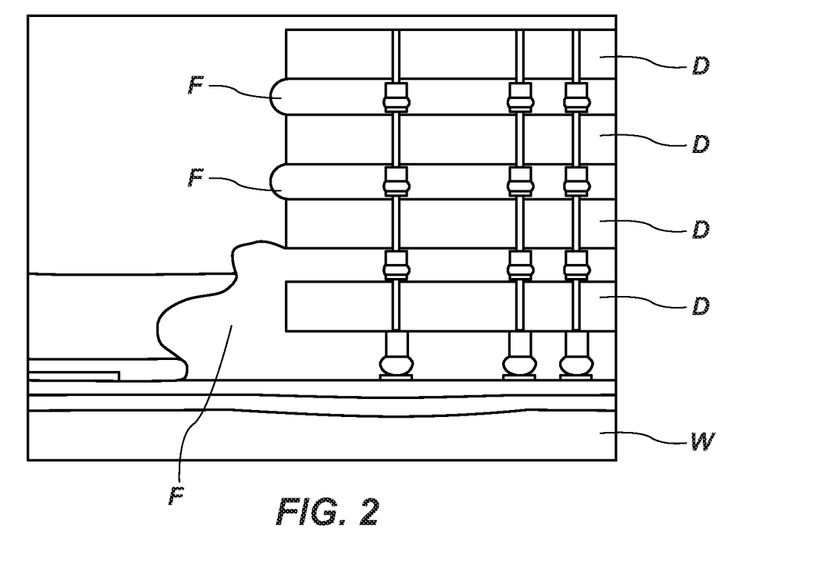
FIG. 2 is a side elevation of a thermocompression bonded semiconductor die stack on a base semiconductor wafer in a C2 W assembly and showing a filet of dielectric material extruded beyond a side of the assembly.
Figure 3:
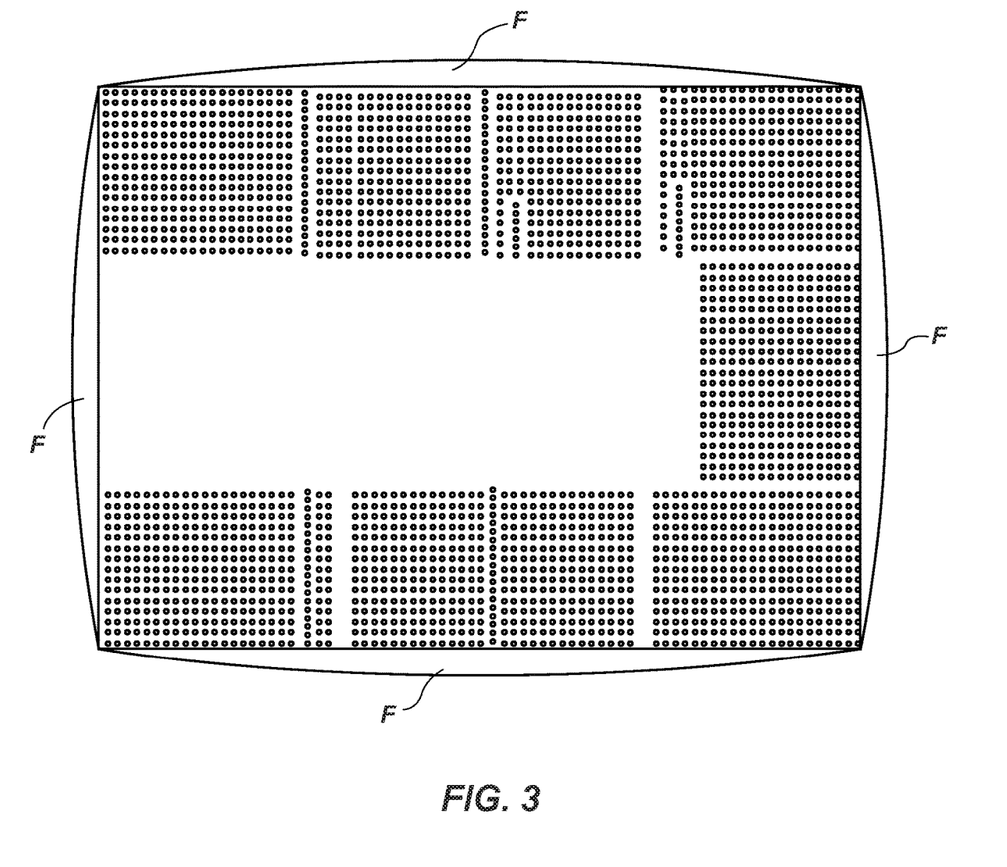
FIG. 3 is a top composite photographic elevation of filets of dielectric material extending beyond the sides of a thermocompression bonded semiconductor die stack.
Figure 4:
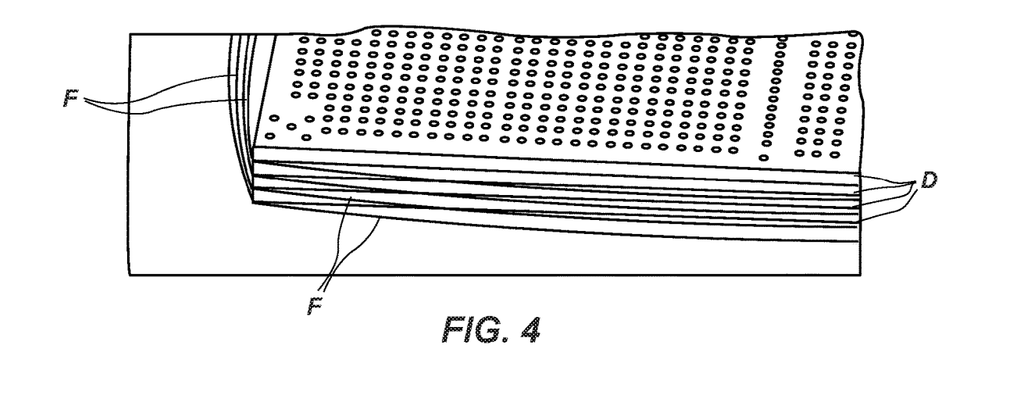
FIG. 4 is a perspective, photographic view of a four-high semiconductor die stack with filets of dielectric film bowed outwardly along sides of the stack.

As a specific example of the abovementioned problems, FIG. 1 is a schematic of filets F of dielectric film extruded beyond the sides of a stack of thermocompression bonded semiconductor die D of a stacked die assembly, the largest filet F located at the bottom of the stack between the lowermost die and supporting substrate. Similarly, FIG. 2 is a schematic of dielectric filets F extruded at the base of and between the die D of a semiconductor die stack thermocompression bonded to a base wafer W in a C2W assembly wherein outermost extents of the filets protrude substantially a common distance beyond sides of the stack. FIG. 3 is a top composite schematic elevation of a thermocompression bonded semiconductor die stack illustrating filets F of dielectric film extruding in a convex (i.e., bowed) shape beyond all four sides of the die stack. FIG. 4 is a perspective schematic view of a four-high semiconductor die stack, wherein filets F of dielectric film between each two adjacent die are bowed outwardly along the sides of the die D of the stack. As is evident from FIGS. 3 and 4, the undesirable protrusion of the dielectric film filets is typically greatest at mid-points of each of the sides of a semiconductor die stack, and tapers inwardly toward the sides approaching the corners of the stack.

DETAILED DESCRIPTION

The following description provides specific details, such as sizes, shapes, material compositions, and orientations in order to provide a thorough description of embodiments of the disclosure. However, a person of ordinary skill in the art would understand that the embodiments of the disclosure may be practiced without necessarily employing these specific details. Embodiments of the disclosure may be practiced in conjunction with conventional fabrication techniques employed in the industry. In addition, the description provided below does not form a complete process flow for manufacturing microelectronic components bearing dielectric films configured according to embodiments of the disclosure, microelectronic components bearing such dielectric films, a complete process flow for fabricating stacks of microelectronic component assemblies including such dielectric films, stacks of microelectronic component assemblies including such dielectric films, or microelectronic devices including such stacked microelectronic component assemblies. Only those process acts and structures necessary to understand the embodiments of the disclosure are described in detail below. Additional process acts to fabricate any of the foregoing structures, assemblies and devices may be performed by conventional fabrication processes.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles between surfaces that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale.

As used herein, the terms "comprising," "including," "containing," "characterized by," and grammatical equivalents thereof are inclusive or open-ended terms that do not exclude additional, unrecited elements or method acts, but also include the more restrictive terms "consisting of" and "consisting essentially of" and grammatical equivalents thereof. As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be, excluded.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, spatially relative terms, such as "beneath," "below," "lower," "bottom," "above," "over," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "over" or "above" or "on" or "on top of" other elements or features would then be oriented "below" or "beneath" or "under" or "on bottom of" the other elements or features. Thus, the term "over" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, the terms "configured" and "configuration" refer to a size, shape, material composition, orientation, and arrangement of one or more of at least one structure and at least one apparatus facilitating operation of one or more of the structure and the apparatus in a predetermined way.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein the terms "layer" and "film" mean and include a level, sheet or coating of material residing on a structure, which level or coating may be continuous or discontinuous between portions of the material, and which may be conformal or non-conformal, unless otherwise indicated.

As used herein, the term "substrate" means and includes a base material or construction upon which additional materials are formed. The substrate may be a semiconductor substrate, a base semiconductor layer on a supporting structure, a metal electrode, or a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein, the terms "comprising," "including," "containing," "characterized by," and grammatical equivalents thereof are inclusive or open-ended terms that do not exclude additional, unrecited elements or method steps, but also include the more restrictive terms "consisting of" and "consisting essentially of" and grammatical equivalents thereof.

As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be excluded.

As used herein, the term "microelectronic component" means and includes by way of non-limiting example, semiconductor die, die exhibiting functionality through other than semiconductive activity, microelectrical mechanical systems (MEMS) devices, substrates comprising multiple die including conventional wafers as well as other bulk substrates as mentioned above, and partial wafers and substrates including more than one die location.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof.

Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may comprise one or more elements.

The inventors herein contemplated merely reducing the dimensions of the dielectric film while maintaining a rectangular shape, so that the edges of the film are inset from sides of the microelectronic component. However, such an approach was considered to be undesirable, as the reduction in material volume of the firm caused a potential for void, particularly at corners of the microelectronic component and increased potential for shorting between adjacent conductive elements, In addition, as circuitry of microelectronic components may extend to within about 100 μm of the sides of a component, there could be no assurance that the reduced dimension dielectric film, even in an extruded condition, would provide adequate electrical isolation for the circuitry along the component periphery, and that there would be no internal voids in the bond line. Further, such an inset boundary of the dielectric film causes the potential for voids between the edges of the film and an EMC encapsulating the component stack.

Figure 5:
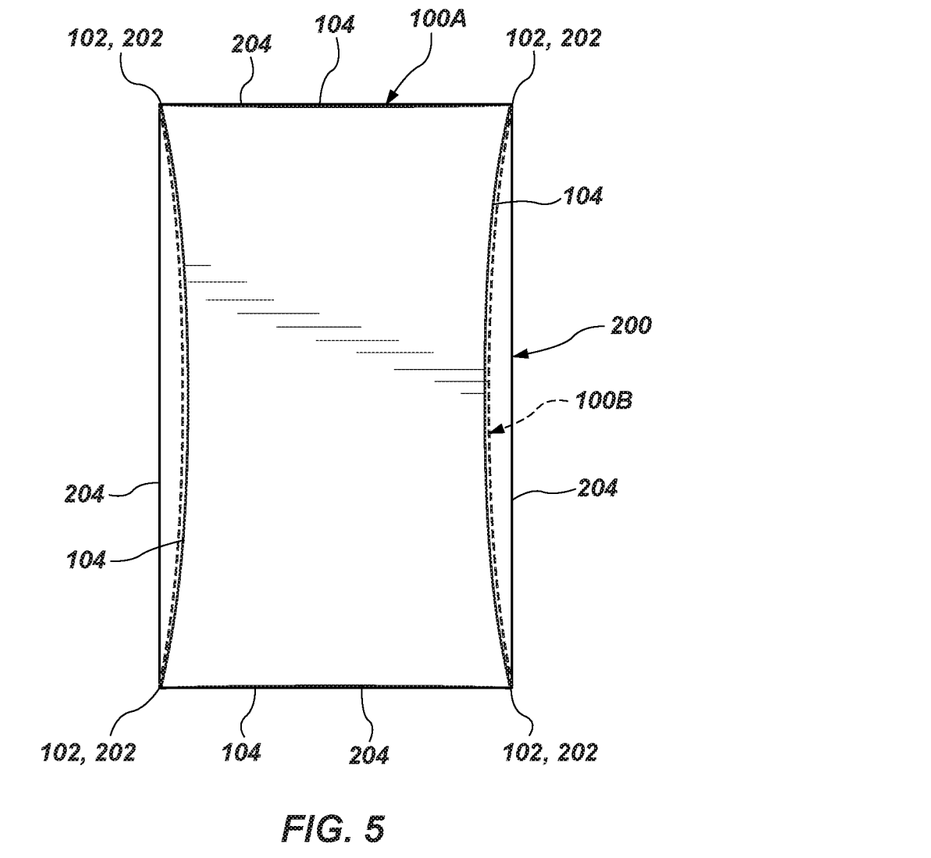
FIG. 5 is a top elevation of a dielectric film configured according to embodiments of the disclosure.

FIG. 5 depicts a preformed dielectric film segment 100A configured in accordance with embodiments of the disclosure. Dielectric film segment 100A has been sized in terms of length L and width W to conform to the shape and dimensions of a microelectronic component 200 (e.g., semiconductor die) to be stacked with one or more other components. As shown, corners 102 of dielectric film segment 100A are located to be substantially coincident with corners 202 of a microelectronic component 200 on which dielectric film segment 100A resides. However, opposing sides 104 of dielectric film segment 100A may be inset in a concave configuration from sides 204 of microelectronic component 200. As shown, the degree of inset may be somewhat proportional to the length of the component side and associated film side. In other words, the longer the side, the greater inset may be desirable to reduce or eliminate a filet. Thus, as shown in FIG. 5, sides 104 of dielectric film segment 100A extend along the length of microelectronic component may be substantially more inset than sides 104 along the width thereof.

Figure 5A:
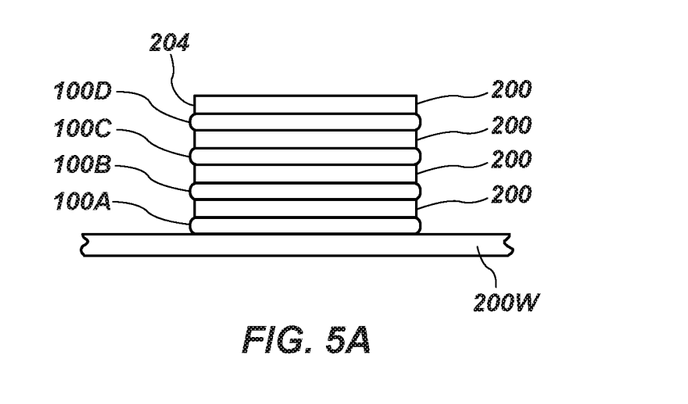
FIG. 5A is a side schematic elevation of a stack of four microelectronic components on a base substrate employing dielectric film segments configured according to embodiments of the disclosure.

Such a configuration, when force and heat are applied and dielectric film segment 100A is compressed between two microelectronic components, allows the material of the dielectric film segment 100A to extrude outwardly as shown by arrows, not substantially exceeding the periphery of microelectronic component 200. As it has been determined, and shown in FIGS. 1 and 2, filets of dielectric film segments configured as a rectangle conforming to a rectangular shape and size of stacked microelectronic components, such as semiconductor die, extend farther beyond the sides of microelectronic components in a stack from relatively upper film levels to relatively lower film levels. Accordingly, and using empirical data, mathematical modeling, or both, the configurations of dielectric film segments 100 used in a stack of microelectronic components 200 (e.g., semiconductor die) may be tailored to accommodate different degrees of extrusion, as shown by way of example as dielectric film segment 100B shown in broken lines, which film segment would be at a progressively higher level in a stack of microelectronic components 200 above dielectric film segment 100A, dielectric film segment 100A being at the base of the stack under a lowermost microelectronic component 200. So, as shown, longer sides of dielectric film segment 100B are inset to a lesser concavity and lesser distance from sides 204 of microelectronic components 200 to accommodate lesser degrees of extrusion, while maintaining coincidence of the film corners 102 with corners 202 of the microelectronic components 200. Subsequently higher components 200 in a stack would have progressively reduced insets. Thus, when multiple microelectronic components are stacked, sides of dielectric film segments 100A, 100B to 100X, where X is the number of components in a stack, will each extrude toward and to, but not substantially exceeding the boundaries of sides 204 of microelectronic components 200, eliminating the potential for excessively protruding filets, as shown in FIG. 5A, wherein four microelectronic components 200 are stacked on a base semiconductor wafer 200W, film segments 100A-100D filling the bond lines B with peripheries protruding slightly beyond, but generally following, the sides of microelectronic components in what may be characterized as a shallow meniscus. Stated another way, the outer peripheries of dielectric films segments 100A-100D will follow in substantial alignment with and remain proximate to the sides of the microelectronic components 200. Of course, instead of a semiconductor wafer 200W, a base substrate for the stack of microelectronic components 200 may comprise, for example, an organic or an inorganic (e.g., silicon) interposer optionally bearing active or inactive circuitry thereon.

It will be appreciated that the sizing and peripheral configurations for dielectric film segments illustrated and described above is non-limiting, in that such sizing and configuring may be tailored to the active surface topography and number and pattern of conductive elements (e.g., conductive pillars) protruding therefrom to accommodate voiding potential in interior areas as well as insufficient peripheral film filling adjacent to adjacent areas of the active surface having few or no conductive elements.

In order to accurately and rapidly separate and configure segments of a dielectric film desirable configurations and sizing for each component to be stacked, a process sequence will now be described in the context of a semiconductor wafer and with reference to FIG. 7, such process being implemented using a photodefinable dielectric film, which may also be referred to as a photimageable dielectric film. Suitable photodefinable dielectric films in the form of NCFs are, without limitation, available in a film form suitable for lamination on a substrate, for example PerMX® 3014 from Du Pont. Other non-limiting examples of photodefinable materials offered in a semi-liquid flowable form, applicable to a substrate by spin coating, include InvterVia® Photodielectric 8023 available from Dow Chemical Company and GR-3570PH available from Shin-Etsu Chemical Co., Ltd. In each example above, the photodefinable material is in an uncured state, at best being in a B-stage state susceptible to full cure during thermocompression bonding conditions. Stated another way the photodefinable material is in at least a partially uncured state when disposed on a semiconductor wafer, and does not fully cure until heated by thermocompression bonding.

In process 300, in act 302 a photodefinable dielectric film in, for example, the form of an NCF is disposed (i.e., laminated or dispensed) onto an active surface of a semiconductor wafer having an array of semiconductor die locations thereon. In act 304, a maskless aligner is programmed with selected configurations for segments of photodefinable dielectric film over each semiconductor die location of the semiconductor wafer, taking into consideration, as necessary due to the aforementioned variance in degree of film extrusion, the order in which each die is to be picked from the semiconductor wafer, the number of die in each stack and the position of each die of the number in the stack. Non-limiting examples of such maskless aligners are commercially available from, for example, EV Group (and identified as MLE technology), headquartered in Austria and having various U.S. locations, and from Heidelberg Instruments, Inc. (and identified as MLA 150) of Torrance, Calif. In act 306, the programmed maskless aligner lithographically patterns the photodefinable dielectric film into respective segments of the selected configurations on each die location of the semiconductor wafer. In act 308, the semiconductor wafer is singulated between the die locations and photodefinable dielectric film segments along streets between the die locations. Subsequently, in act 310, singulated semiconductor die are picked from the semiconductor wafer in a programmed order, inverted and stacked so that the die in each stack are properly ordered, bottom to top, with photodefinable dielectric film segments of the proper size and configuration at each inter-component bond line level for each stack formed.

Figure 6A:
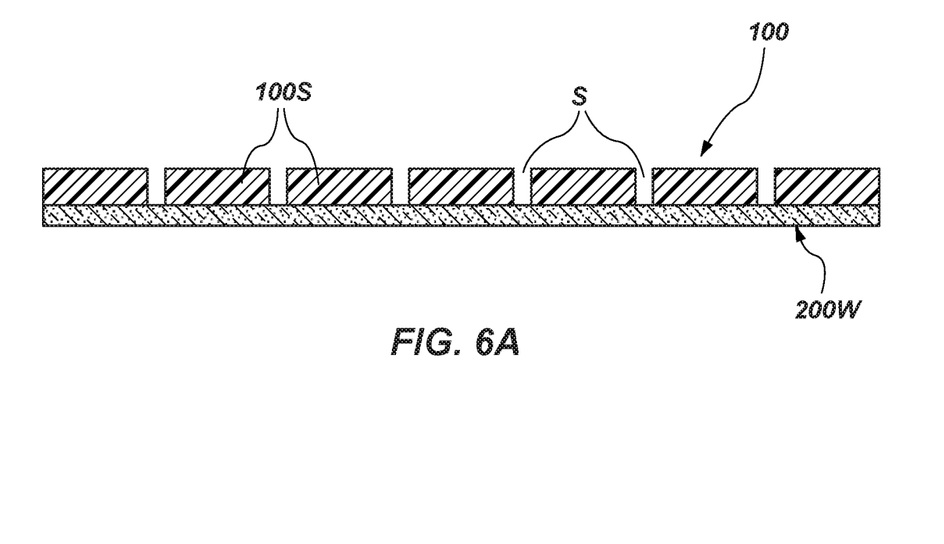
FIGS. 6A through 6D are schematic cross-sectional elevations depicting a process for forming a dielectric film configuration on semiconductor die according to embodiments of the disclosure, and resulting structures.
Figure 6B:
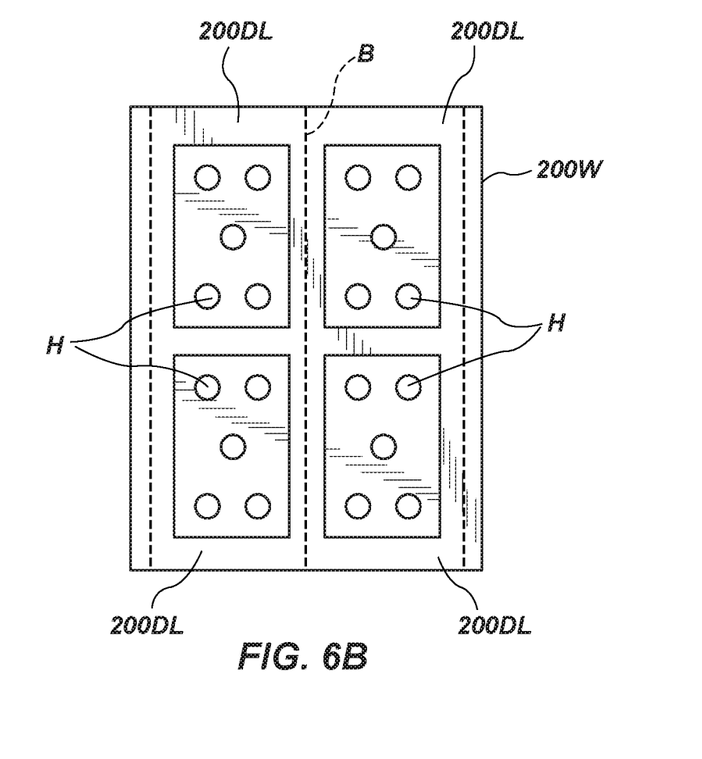
Figure 6C:
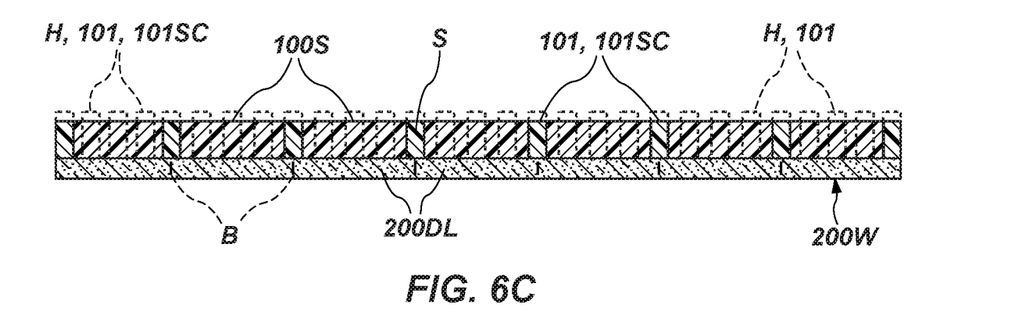
Figure 6D:
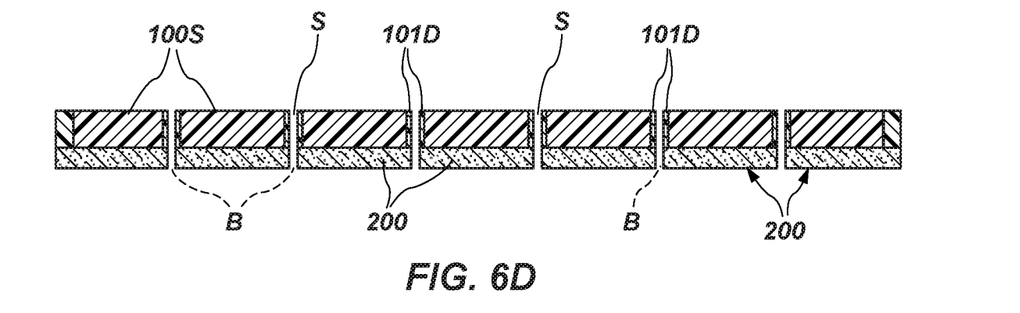
Figure 6E:
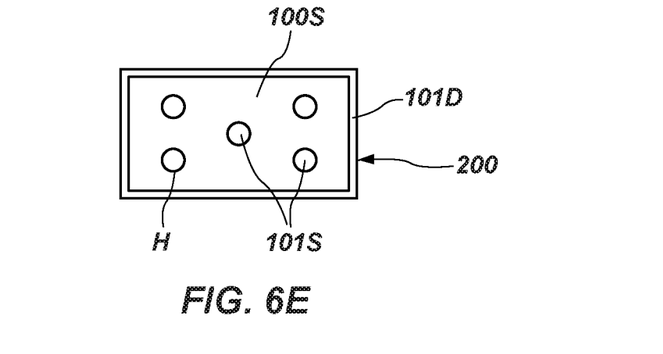
FIG. 6E is a schematic top elevation of a semiconductor die fabricated according to the process of FIGS. 6A through 6D.

In other embodiments of the disclosure, as illustrated and described with respect to FIGS. 6A through 6E, a photodefinable dielectric film is employed in another manner to avoid squeeze out and offer additional advantages. Referring now to FIG. 6A, a photodefinable dielectric film segment 100 of a suitable type, such as but not limited to, those described above with respect to FIGS. 5 and 7, has been disposed on a semiconductor wafer 200W, and patterned using a maskless aligner into segments 100S separated by streets S. As shown in FIG. 6B, which depicts a segment of a wafer 200W comprising four unsingulated semiconductor die locations 200DL of wafer 200W on which are located four photodefinable dielectric film segments 100S. As shown, peripheries of photodefinable film segments 100S are set back from boundaries B, indicated in broken lines, between semiconductor die locations 200DL and also include holes H therein. Such setbacks and holes are placed to accommodate additional dielectric material, as depicted in FIG. 6C, wherein such additional dielectric material 101 has been disposed within holes H (shown in broken lines) and within streets S between photodefinable film segments 100S on wafer 200W. Additional dielectric material 101 may be applied, for example, by a spin-on process, by dispensing from a nozzle, and in either instance removed from the upper surfaces of photodefinable dielectric film segments 100S by, for example, a squeegee. As another approach, a mask process may be employed to fill holes H and streets S, providing the opportunity to fill holes H and streets S with the additional dielectric material 101 to a height (exaggerated for clarity) greater than that of the photodefinable dielectric film segments 100S, as shown in broken lines. The additional dielectric material 101 may comprise, for example, the same or another photodefinable material 101 as that of photodefinable dielectric film segments 100S and which may be altered (e.g., cured) in situ to at least a substantially solid state using a mask to substantially limit heat from a heat source to photodefinable dielectric material 101 without curing the photodefinable dielectric film segments 100S, or by scanning a directed energy beam (i.e., laser beam on electron beam) to substantially limit curing heat to photodefinable dielectric material 101. As another example, a self-curing dielectric material 101SC, such as a self-curing polyimide may be disposed in holes H and streets S and altered from a flowable state to at least a substantially solid state in situ. As shown in FIG. 6D, semiconductor wafer 200W may then be singulated within streets S and along and spanning boundaries B between semiconductor die locations 200DL, resulting in singulated semiconductor die 200 with photodefinable dielectric film segments 100S contained within peripheral dams 101D of cured additional dielectric material 101 substantially proximate and substantially aligned with sides of semiconductor die 200, and stops 101S of cured additional dielectric material 101 within holes H, such a semiconductor die 200 being shown from a top elevation in FIG. 6E.

As will be appreciated by those of ordinary skill in the art, the presence of peripheral dams 101D may limit squeeze-out of photodefinable dielectric film segments 100S and bridging between microelectronic component stacks during thermocompression bonding, while the presence of stops 101S may provide flow control of photodefinable dielectric film segments 100S during thermocompression bonding, as well as allowing control of bond line thickness between adjacent, stacked semiconductor die or other microelectronic components. Further, and as noted above, conventional and conventionally configured dielectric film segment may exhibit greater squeeze out toward the bottom of a component stack, resulting in larger filets and bridging of the film material between component stacks, increasing warpage of a base wafer or other substrate, as well as thinner and non-uniform bond lines. To counter this, a partial "pre-cure" of the film material has been implemented in some instances. However, such an approach may undesirably limit the flowability of the dielectric film. In embodiments of the disclosure, and particularly the embodiments of FIGS. 6A-6E, the presence of stops serves as standoffs between stacked components, allowing greater bond line thickness uniformity and reducing a need for a pre-cure of the dielectric film. Further, the presence of stops may lessen wafer warpage as, during thermocompression bonding the components and base wafer or other substrate are flattened against the stops under applied force, rather than floating on solder caps of conductive elements extending between the components.

Of course, the configuration of patterned photodefinable dielectric film segments 100S is not limited to that illustrated and described herein. For example, the number and pattern of holes may be tailored to accommodate the number and pattern of conductive elements (e.g., pillars) protruding from the active surface of a semiconductor die over which photodefinable dielectric film segment has been located. Likewise, the periphery of photodefinable dielectric film segments may include scallops in the linear sides or protrusions therefrom to better engage the surrounding additional dielectric material. Further, internal dam segments of additional dielectric material may be placed and cured in voids in a photodefinable dielectric film segment 100S prior to die stacking and thermocompression bonding, to provoke preferential filling of the bond line with photodefinable material in bond line areas found to be susceptible to voiding, such as between unusually closely-spaced conductive elements. In addition, holes of different sizes and shapes, including elongated and arcuate holes, may be provided within a dielectric film segment to facilitate flow dielectric film flow to certain areas of the bond line.

Figure 8:
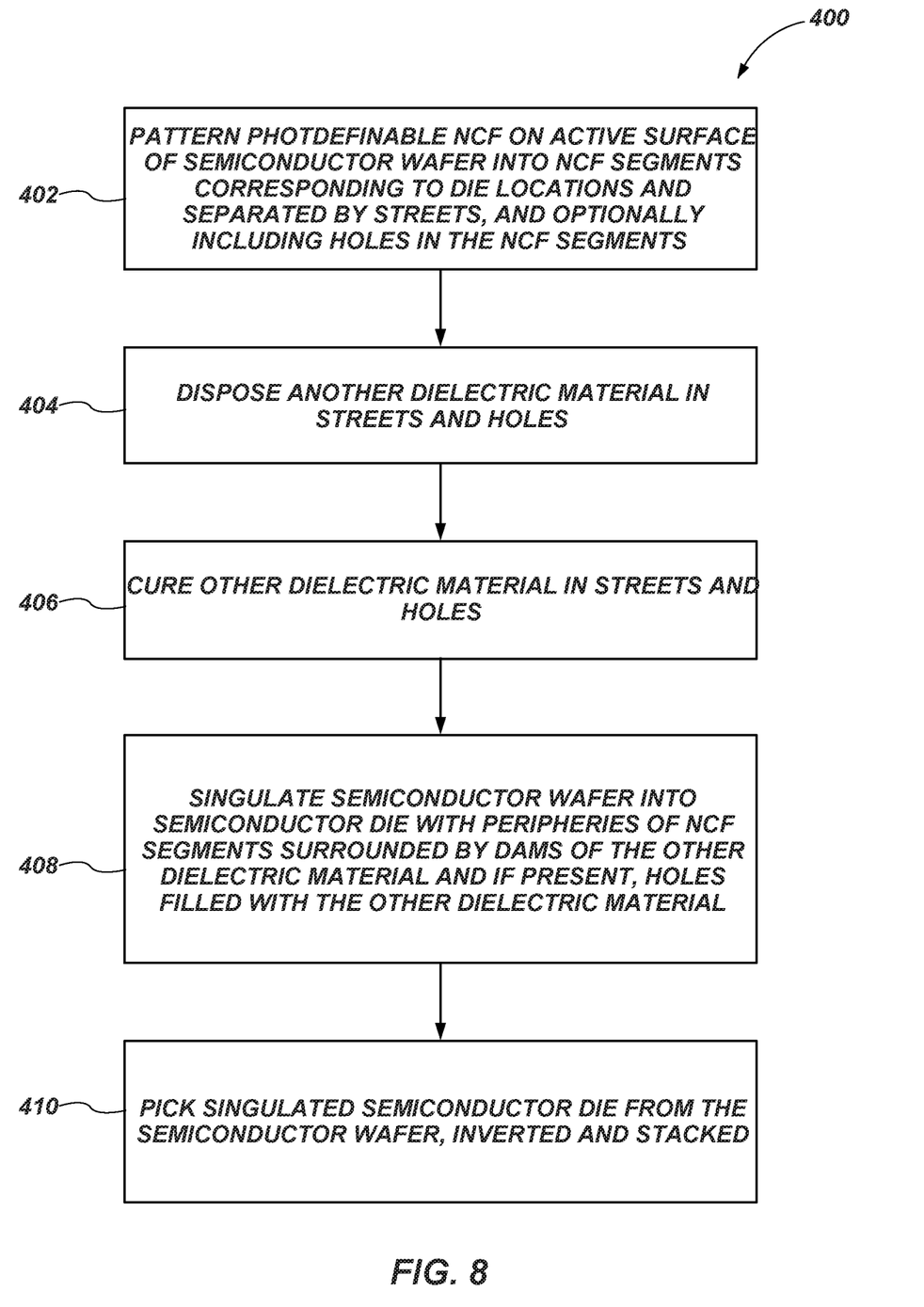
FIG. 8 is a flow diagram of the process of FIGS. 6A-6D to fabricate semiconductor die as illustrated in FIG. 6E and subsequent stacking thereof.

FIG. 8 is a flow diagram of a process sequence 400 for implementation of embodiments 6A through 6E of the disclosure. In act 402, a photodefinable dielectric material in the form, for example of a photodefinable NCF applied to an active surface of a semiconductor wafer has been patterned into NCF segments corresponding to die locations and separated by streets, and optionally including holes in the NCF segments. In act 404, another dielectric material has been disposed in the streets and holes. In act 406, the other dielectric material has been cured to a substantially solid state. In act 408, semiconductor wafer has been singulated into semiconductor die with peripheries of the NCF segments surrounded by dams of the other dielectric material and if present, holes in the NCF segments filled with the other dielectric material. In act 410, singulated semiconductor die are picked from the semiconductor wafer, inverted and stacked with photodefinable dielectric film segments of the proper size and configuration at each inter-component bond line level for each stack formed.

Figure 7:
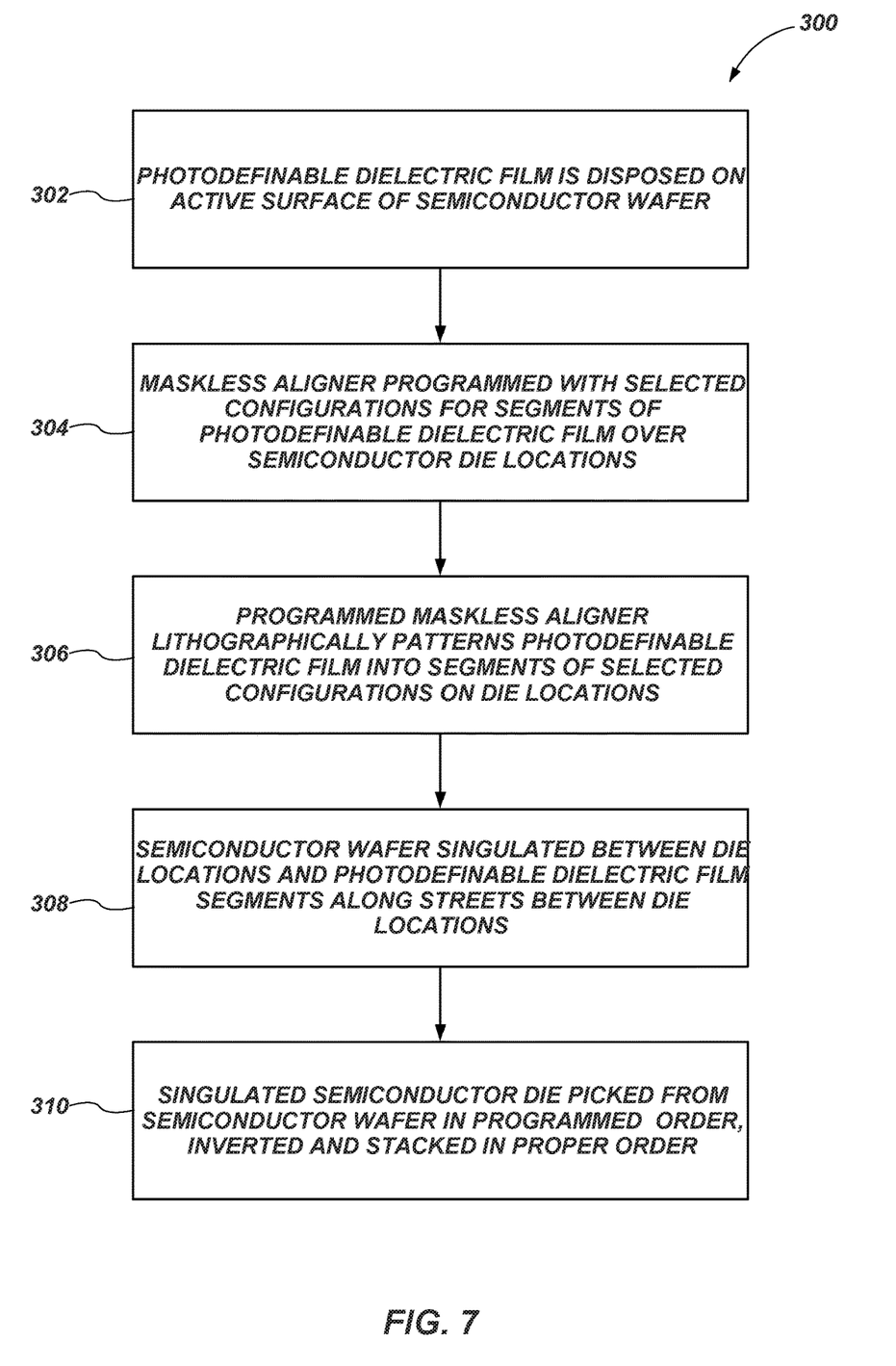
FIG. 7 is a flow diagram of a process for fabricating a photodefinable film segment as illustrated in FIG. 5, and a stack of microelectronic components on a base substrate as illustrated in FIG. 5A.

It is contemplated that, although the embodiments of FIGS. 5, 5A and 7 and those of FIGS. 6A-E and 8 have been described separately for clarity, that features of one embodiment may be employed with those of another. For example, the concavely inset peripheries of dielectric film segments of one embodiment may be combined with holes within the film segment. Likewise, an inset dielectric film segment periphery may have dams of another dielectric material on fewer than four sides. Similarly, all features described with an embodiment need not always be implemented. For example and as noted above, a dielectric film segment without holes may be surrounded with a dam of another dielectric material.

As will be appreciated by those of ordinary skill in the art, embodiments of the disclosure offer at least the capability of enhanced yield of microelectronic component assemblies wherein components are stacked on one another in terms of avoidance of shorting, uniformity of bond line thickness, and enhanced integrity of an EMC encapsulating the stack at minimal additional cost and process time.

In embodiments, a process comprises applying a dielectric film over an active surface of a semiconductor substrate comprising an array of semiconductor die locations, patterning the dielectric film into segments, each segment corresponding to a semiconductor die location and separated from other adjacent segments by streets, the patterning further comprising insetting at least some peripheries of the segments from sides of the semiconductor die locations between corners of the semiconductor die locations while corners of the segments are substantially coincident with corners of the semiconductor die locations.

In embodiments, an article comprises a microelectronic component having a dielectric material segment located over an active surface thereof, the dielectric material having corners substantially coincident with corners of the microelectronic component, and at least two opposing sides inset from sides of the microelectronic component between the corners in a substantially concave configuration.

In embodiments, a process comprises disposing a photodefinable material over an active surface of a semiconductor substrate, segmenting the photodefinable material corresponding to semiconductor die locations of the semiconductor substrate into material segments separated by streets spanning boundaries between the semiconductor die locations, filling the streets with another dielectric material, altering the other dielectric material to at least a substantially solid state and singulating the semiconductor die locations into semiconductor die through the other dielectric material in the streets along the boundaries and through the semiconductor substrate.

In embodiments, an article comprises a semiconductor die having an at least partially uncured photodefinable dielectric material over an active surface thereof, the photodefinable dielectric material having an outer periphery recessed from an outer periphery of the semiconductor die, and another dielectric material in a substantially solid state surrounding the outer periphery of the photodefinable dielectric material and having an outer periphery substantially proximate and substantially aligned with the outer periphery of the semiconductor die.

In embodiments, a microelectronic component assembly comprises a stack of at least two microelectronic components interconnected by conductive elements extending between each two adjacent microelectronic components of the at least two microelectronic components and a dielectric bond line located between each two adjacent microelectronic components, laterally surrounding the conductive elements and having an outer boundary substantially following and proximate sides of two respective adjacent microelectronic components. The dielectric bond line comprises a cured photodefinable material having an outer boundary inset from the sides of the two respective adjacent microelectronic components and another dielectric material in a substantially solid state in contact with and surrounding the cured photodefinable dielectric material.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A process, comprising:
   applying a dielectric film over an active surface of a semiconductor substrate comprising an array of semiconductor die locations; and
   patterning the dielectric film into segments, each segment corresponding to a respective associated semiconductor die location and separated from other adjacent dielectric film segments by streets, the patterning comprising insetting at least some peripheral portions of the dielectric film segments from sides of their respective associated semiconductor die locations and configuring corners of the dielectric film segments to be substantially coincident with corners of their respective associated semiconductor die locations.

2. The process of claim 1, further comprising insetting the at least some peripheral portions of the dielectric film segments in a substantially concave shape.

3. The process of claim 2, further comprising insetting the at least some peripheral portions of at least some of the dielectric film segments to a different degree of substantial concavity corresponding to an intended semiconductor die location, after singulation from the semiconductor substrate, in a stack of semiconductor die.

4. The process of claim 3, further comprising:
   singulating the semiconductor die locations into semiconductor die, each semiconductor die bearing a dielectric film segment; and
   picking semiconductor die in an order corresponding to an intended location of each semiconductor die in a stack of semiconductor die with the at least some peripheral portions of the dielectric film segments configured with a degree of substantial concavity corresponding to the intended semiconductor die location in the stack of semiconductor die.

5. The process of claim 4, further comprising inverting each picked semiconductor die prior to stacking thereof, and stacking each picked semiconductor die according to the intended location thereof in the stack of semiconductor die.

6. The process of claim 1, wherein applying the dielectric film comprises applying a photodefinable dielectric film, and patterning the photodefinable dielectric film is effected using a maskless aligner.

7. The process of claim 6, wherein applying the photodefinable dielectric film comprises one of laminating a preformed photodefinable dielectric film and dispensing a photodefinable dielectric material in a semi-liquid flowable state by spin coating.

8. An article, comprising:
   a microelectronic component having a dielectric material segment located over an active surface thereof, the dielectric material having corners substantially coincident with corners of the microelectronic component, and at least two opposing sides of the dielectric material inset from sides of the microelectronic component in a substantially concave configuration.

9. The article of claim 8, wherein the dielectric material segment comprises a photodefinable material.

10. A process, comprising:
    disposing a photodefinable dielectric material over an active surface of a semiconductor substrate;
    segmenting the photodefinable dielectric material corresponding to semiconductor die locations of the semiconductor substrate into material segments separated by streets spanning boundaries between the semiconductor die locations;
    filling the streets with another dielectric material;
    altering the other dielectric material to a substantially solid state; and
    singulating the semiconductor die locations into semiconductor die through the other dielectric material in the streets along the boundaries and through the semiconductor substrate.

11. The process of claim 10, further comprising segmenting the photodefinable dielectric material with a maskless aligner.

12. The process of claim 10, further comprising selecting the other dielectric material to be a photodefinable dielectric material or a self-curing dielectric material.

13. The process of claim 10, further comprising patterning holes in the photodefinable dielectric material, and substantially concurrently filling the streets and the holes with the other dielectric material and substantially concurrently altering the other dielectric material in the streets and the holes to a substantially solid state.

14. The process of claim 13, further comprising selecting the other dielectric material to be a photodefinable dielectric material or a self-curing dielectric material.

15. An article, comprising:
a semiconductor die having an at least partially uncured photodefinable dielectric material over an active surface thereof, the photodefinable dielectric material having an outer periphery recessed from an outer periphery of the semiconductor die; and
another dielectric material in a substantially solid state surrounding the outer periphery of the photodefinable dielectric material and having an outer periphery substantially proximate and substantially aligned with the outer periphery of the semiconductor die.

16. The article of claim 15, further comprising holes in the uncured photodefinable dielectric material, the holes being filled with the other dielectric material in a substantially solid state.

17. A microelectronic component assembly, comprising:
a stack of at least two microelectronic components interconnected by conductive elements extending between each two adjacent microelectronic components of the at least two microelectronic components; and
a dielectric bond line located between each two adjacent microelectronic components, laterally surrounding the conductive elements and having an outer boundary substantially following and proximate sides of two respective adjacent microelectronic components, the dielectric bond line comprising:
a cured photodefinable dielectric material having an outer boundary inset from the sides of the two respective adjacent microelectronic components; and
another dielectric material in a substantially solid state in contact with and surrounding the cured photodefinable dielectric material.

18. The microelectronic component assembly of claim 17, further comprising holes extending through the cured photodefinable dielectric material between the two respective adjacent microelectronic components and filled with the other dielectric material in a substantially solid state.

19. The microelectronic component assembly of claim 17, further comprising an epoxy molding compound (EMC) encapsulating at least sides of the microelectronic component assembly and abutting a base microelectronic component on which the stack is located.

20. The microelectronic component assembly of claim 19, wherein the base microelectronic component comprises one of a base wafer segment comprising integrated circuitry, an inorganic interposer, or an organic interposer.

* * * * *